United States Patent
Otake et al.

(10) Patent No.: US 7,564,890 B2
(45) Date of Patent: Jul. 21, 2009

(54) LASER EQUIPMENT

(75) Inventors: Nobuyuki Otake, Nukata-gun (JP); Katsunori Abe, Chita-gun (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/641,112

(22) Filed: Dec. 19, 2006

(65) Prior Publication Data

US 2007/0217474 A1   Sep. 20, 2007

(30) Foreign Application Priority Data

Dec. 20, 2005   (JP)   ............................. 2005-366899

(51) Int. Cl.
    *H01S 3/08* (2006.01)
(52) U.S. Cl. .............................. 372/99; 372/97; 372/75; 372/50.1; 372/21; 372/23
(58) Field of Classification Search ............. 372/21–23, 372/50.12, 50.121, 50.124, 50.22, 75, 97, 372/99
    See application file for complete search history.

(56) References Cited

U.S. PATENT DOCUMENTS

| | | | |
|---|---|---|---|
| 5,513,204 A |  | 4/1996 | Jayaraman |
| 5,796,771 A | * | 8/1998 | DenBaars et al. .............. 372/75 |
| 5,802,086 A | * | 9/1998 | Hargis et al. ................... 372/22 |
| 5,982,802 A | * | 11/1999 | Thony et al. ................... 372/75 |
| 6,117,699 A |  | 9/2000 | Lemoff et al. |
| 6,130,873 A |  | 10/2000 | Lazarev et al. |
| 6,208,609 B1 |  | 3/2001 | Hang et al. |
| 6,259,121 B1 |  | 7/2001 | Lemoff et al. |
| 6,636,537 B2 |  | 10/2003 | Takada |
| 6,636,544 B2 | * | 10/2003 | Baillargeon et al. ......... 372/50.1 |
| 6,879,618 B2 |  | 4/2005 | Cok et al. |
| 6,940,885 B1 | * | 9/2005 | Cheng et al. ................ 372/50.1 |
| 2001/0021214 A1 |  | 9/2001 | Jiang et al. |
| 2002/0054618 A1 |  | 5/2002 | Jiang et al. |
| 2003/0007538 A1 |  | 1/2003 | Jiang et al. |
| 2004/0076202 A1 |  | 4/2004 | Patton et al. |
| 2008/0095202 A1 |  | 4/2008 | Yanagisawa et al. |

FOREIGN PATENT DOCUMENTS

| | | |
|---|---|---|
| JP | U-H04-26559 | 3/1992 |
| JP | A-05-055671 | 3/2003 |
| JP | A-2003-243754 | 8/2003 |
| JP | A-2005-321663 | 11/2005 |

OTHER PUBLICATIONS

Office Action dated Nov. 4, 2008 in corresponding Japanese patent application No. 2005-366899 (and English translation).

* cited by examiner

*Primary Examiner*—Minsun Harvey
*Assistant Examiner*—Tod T Van Roy
(74) *Attorney, Agent, or Firm*—Posz Law Group, PLC

(57) ABSTRACT

A laser equipment for outputting output lights having different wavelengths includes: a substrate; an excitation light generation element for emitting excitation lights including surface emitting laser elements and disposed on the substrate; and a light converter having a pair of second reflection layers and a solid laser medium layer, both of which provide a resonator. The solid laser medium layer is capable of generating lights having different peak wavelengths by receiving the excitation lights. The light converter is disposed on an output surface of the excitation light generation element.

7 Claims, 6 Drawing Sheets ered that polarization is caused in color. Further, since light sources for exciting Yb and Nd are individually required, it is difficult to make the device compact.

LASER EQUIPMENT

CROSS REFERENCE TO RELATED APPLICATION

This application is based on Japanese Patent Application No. 2005-366899 filed on Dec. 20, 2005, the disclosure of which is incorporated herein by reference.

FIELD OF THE INVENTION

The present invention relates to a laser equipment.

BACKGROUND OF THE INVENTION

An optical parametric oscillator has been formerly used as the multiple wavelength laser device using light excitation. However, it is necessary to mechanically adjust a laser incident angle to a nonlinear crystal so as to realize a multiple wavelength. Therefore, there is a problem in points of high speed formation and reproducibility of the wavelength. Further, a problem exists in that an optical system of many stages is required, and the device is large-sized. In contrast to this, for example, JP-A-2003-243754 and JP-A-2002-151774 (corresponding to U.S. Pat. No. 6,636,537) are disclosed.

A multiple wavelength laser device shown in JP-A-2003-243754 is set to a construction in which Yb and Nd are added to a laser base material as rare earth ions, and plural lights of different wavelengths emitted from ion elements are selectively laser-oscillated by a multiple wavelength selecting element. A multiple wavelength laser device shown in U.S. Pat. No. 6,636,537 is formed by constructing a resonant optical system different every wavelength.

Further, JP-A-2005-20002 (corresponding to U.S. Pat. No. 6,879,618) discloses a construction in which an organic active layer constituting a vertical laser resonator is excited by incoherent light outputted from an organic light emitting diode as an excitation light source, and is resonated by a reflecting mirror and a laser beam is outputted. The organic active layer includes organic molecules of a host and a dopant, and the incoherent light is absorbed by a host material. Thereafter, excitation energy can be moved to the dopant by a Foerster type energy movement. Namely, the laser beam having a wavelength proper to the dopant is outputted.

Transition probability of rare earth is different in each element, and is also different in accordance with an energy level even within the same element. Further, the reflectivity of the reflecting mirror constituting the resonator has wavelength dependence property. Accordingly, in the construction shown in JP-A-2003-243754, when the resonances of plural lights of different wavelengths are simultaneously executed, it is difficult to set light emitting intensity of each wavelength to the same. For example, when the multiple wavelength laser device is set to an RGB light source for display, it is considered that polarization is caused in color. Further, since light sources for exciting Yb and Nd are individually required, it is difficult to make the device compact.

In the case of the construction shown in U.S. Pat. No. 6,636,537, as mentioned above, since the resonant optical system different every wavelength is required, it is difficult to make the device compact.

Further, in the construction shown in U.S. Pat. No. 6,879,618, when it is considered that the resonances of plural lights of different wavelengths are simultaneously executed, it is necessary to select a host material and a dopant material suitable for each wavelength. Further, the excitation light source is required every each wavelength. Accordingly, it is difficult to make the device compact. Further, after the incoherent light is absorbed by the host material, excitation energy is moved to the dopant and light is emitted. Therefore, a problem exists in that conversion efficiency to the laser beam is low.

SUMMARY OF THE INVENTION

In view of the above-described problem, it is an object of the present disclosure to provide a laser equipment.

A laser equipment for outputting a plurality of output lights having different wavelengths includes: a substrate; an excitation light generation element for emitting a plurality of excitation lights, wherein the excitation light generation element includes a plurality of surface emitting laser elements having a pair of first reflection layers and an activation layer disposed between the pair of first reflection layers, and wherein the surface emitting laser elements are disposed on the substrate so that the surface emitting laser elements provide a surface emitting laser array; and a light converter having a pair of second reflection layers and a solid laser medium layer disposed between the pair of second reflection layers, wherein the pair of second reflection layers and the solid laser medium layer provide a resonator. The solid laser medium layer is capable of generating a plurality of lights having different peak wavelengths by receiving the excitation lights, and the light converter is disposed on an output surface of the excitation light generation element.

In the above equipment, the light converter is stacked on the excitation light generation element. Thus, dimensions of the equipment are reduced. Further, the excitation lights emitted from the surface emitting laser array is controlled with vertical mode control, so that a rare earth ion or a transition metal ion in the solid laser medium layer is activated directly so as to excite between energy levels thereof. Thus, the output lights having different wavelengths are outputted from the equipment with high efficiency.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment Mode

Figure 1:
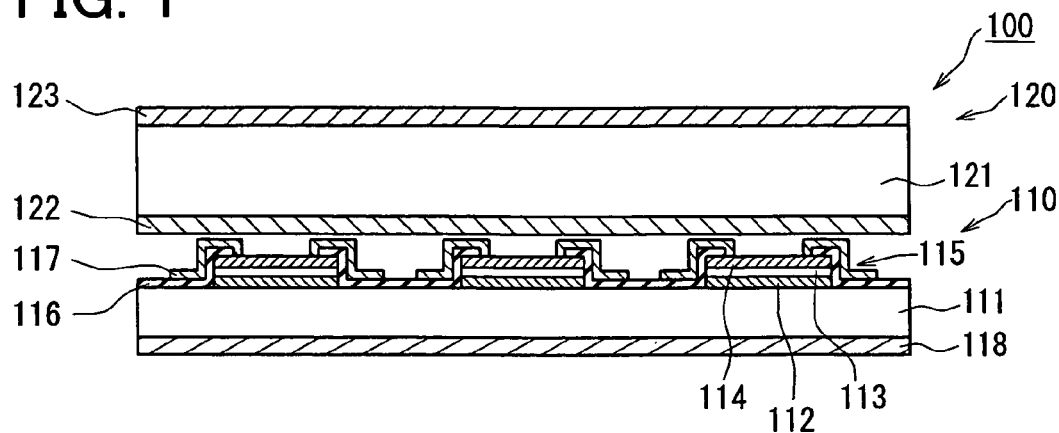
FIG. 1 is a cross sectional view showing a laser equipment according to a first embodiment.

FIG. 1 is a cross-sectional view showing the schematic construction of a multiple wavelength laser device in accordance with a first embodiment mode. The multiple wavelength laser device includes an excitation light generating section for outputting a laser beam as excitation light, and a wavelength converting section for receiving the excitation light outputted from this excitation light generating section and outputting light of a wavelength different from that of the excitation light. The multiple wavelength laser device is constructed so as to output plural lights of different wavelengths to the device exterior.

As shown in FIG. 1, the excitation light generating section 110 includes at least a plane light emitting laser array constructed by forming plural plane light emitting laser elements on the same substrate. In this embodiment mode, the excitation light generating section 110 is constructed by only the plane light emitting laser array. In the following description, reference numeral 110 is also given to the plane light emitting laser array. A well-known structure can be adopted as the construction of the plane light emitting laser array 110.

Concretely, an $Al_{z1}Ga_{1-z1}As/Al_{z2}Ga_{1-z2}As$ ($0 \leq z1 < z2 \leq 1$) multilayer reflecting film 112 added with an n-type dopant is formed on one face of an n-GaAs substrate 111. The multilayer reflecting film 112 formed by laminating this $Al_{z1}Ga_{1-z1}As$ layer and the $Al_{z2}Ga_{1-z2}As$ layer is one of first reflecting layers (on an opposite output side of excitation light described later), and is shown below as a first reflecting layer 112.

An unillustrated AlGaAs clad layer, an $Al_{x1}In_{y1}Ga_{1-x1-y1}As/Al_{x3}In_{y3}Ga_{1-x3-y3}As$ multiple quantum well layer 113, and an unillustrated AlGaAs clad layer are sequentially laminated on the first reflecting layer 112. The multiple quantum well layer 113 formed by laminating the $Al_{x1}In_{y1}Ga_{1-x1-y1}As$ layer and the $Al_{x3}In_{y3}Ga_{1-x3-y3}AS$ layer is an active layer, and is shown below as the active layer 113. The composition and the film thickness of the active layer 113 are adjusted so as to output a laser beam having a predetermined desirable light emitting wavelength. In this embodiment mode, the active layer 113 is formed such that an optical film thickness becomes one wavelength. The active layer 113 is adjusted such that the light emitting wavelength is included in a range of 790 to 810 nm.

An $Al_{z3}Ga_{1-z3}As/Al_{z4}Ga_{1-z4}As$ ($0 \leq z3 < z4 \leq 1$) multilayer reflecting film 114 added with a p-type dopant is formed on the AlGaAs clad layer. The multilayer reflecting film 114 formed by laminating this $Al_{z3}Ga_{1-z3}As$ layer and the $Al_{z4}Ga_{1-z4}As$ layer is one (on the output side of excitation light described later) of first reflecting layers, and is shown below as the first reflecting layer 114.

The film thickness of each layer constituting the first reflecting layers 112, 114 of a multilayer structure is set to a value provided by dividing the light emitting wavelength by four times a refractive index. The refractive index is adjusted such that reflectivity of the first reflecting layer 112 becomes greater than that of the first reflecting layer 114 with respect to the laser beam (hereinafter shown as excitation light) outputted from the active layer 113. Namely, a resonator is constructed by the first reflecting layer 112, the active layer 113 and the first reflecting layer 114. The excitation light outputted from the active layer 113 is constructed so as to be resonated by the first reflecting layers 112, 114 and be oscillated on the first reflecting layer 114 side.

Each of the above layers can be formed by using a crystal growth method such as well-known MOCVD (organic metal vapor phase growth) method, MBE (molecular beam epitaxy) method, etc. After the crystal growth, a plane light emitting laser element 115 is constructed via processes of mesa etching for element separation, formation of an insulating film, evaporation of an electrode film, etc. Namely, a plane light emitting laser array 110 having plural plane light emitting laser elements 115 one-dimensionally or two-dimensionally arranged on the n-GaAs substrate 111 is constructed.

In FIG. 1, reference numeral 116 designates an insulating film (a silicon oxide film in this example) for strangulating light of a horizontal direction (a substrate planar direction) and an electric current. Reference numeral 117 designates a p-type electrode (Cr/Pt/Au in this example), and reference numeral 118 designates an n-type electrode (Au—Ge/Ni/Au in this example). As shown in FIG. 1, the p-type electrode 117 is electrically separated every plane light emitting laser element 115. Namely, the individual plane light emitting laser element 115 is constructed so as to be independently controlled.

Next, the wavelength converting section will be explained. As shown in FIG. 1, the wavelength converting section 120 includes at least a solid laser medium layer 121, and second reflecting layers 122, 123 respectively formed on excitation light input face and output face of the solid laser medium layer 121, and is laminated and arranged on an output face of the plane light emitting laser array 110 with the second reflecting layer 122 as an abutting face. This embodiment mode is characterized in the construction of the second reflecting layers 122, 123 with respect to the solid laser medium layer 121.

Figure 2:
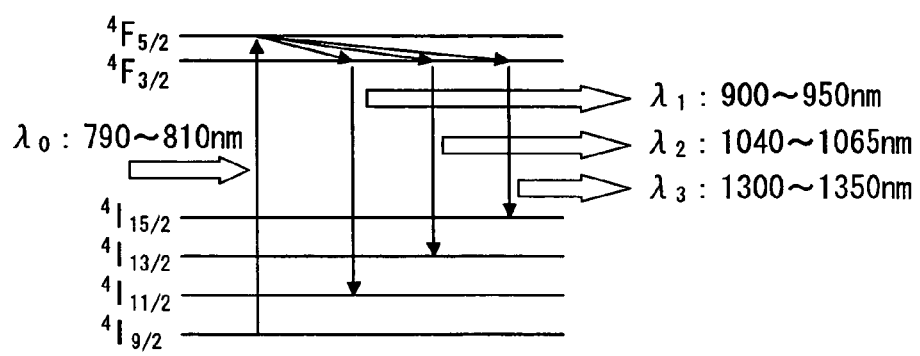
FIG. 2 is a schematic chart showing excitation and transition in a solid laser medium layer.

Concretely, a Nd:YAG ($Y_3Al_5O_{12}$) crystal is adopted as a constructional material of the solid laser medium layer 121, and the solid laser medium layer 121 is arranged so as to cover the entire output face of the plane light emitting laser array 110. As mentioned above, when the excitation light adjusted within a range of 790 to 810 nm with respect to light emitting wavelength $\lambda_0$ is received from the plane light emitting laser array 110, as shown in FIG. 2, an electron is selectively excited during the energy level of an Nd ion added to the YAG crystal from $^4I_{9/2}$ to $^4F_{5/2}$. Absorption is large from $^4I_{9/2}$ to $^4F_{5/2}$ and excitation can be efficiently performed. FIG. 2 is a typical view showing excitation and transition in the solid laser medium layer 121.

As shown in FIG. 2, the electron excited to energy level $^4F_{5/2}$ is once transited to $^4F_{3/2}$ by non-radiant relaxation involving no light emission, and is then respectively transited to $^4I_{11/2}$, $^4I_{13/2}$, and $^4I_{15/2}$. In accordance with this transition, laser beams having peak wavelengths $\lambda_1, \lambda_2, \lambda_3$ within ranges of 900 to 950 nm (946 nm in this example), 1040 to 1065 nm (1064 nm in this example) and 1300 to 1350 nm (1319 nm in this example) in accordance with wavelength $\lambda_0$ of the excitation light are respectively generated. Namely, plural laser beams of different peak wavelengths are outputted from the same solid laser medium layer 121 by receiving the excitation light.

The second reflecting layers 122, 123 are divided into plural areas in accordance with constructional differences, and are constructed so as to be resonated at different peak wavelengths every area. For example, the construction of the second reflecting layers 122, 123 is at least one of a constructional material (refractive index), a thickness and a laminating number (period).

Figure 3:
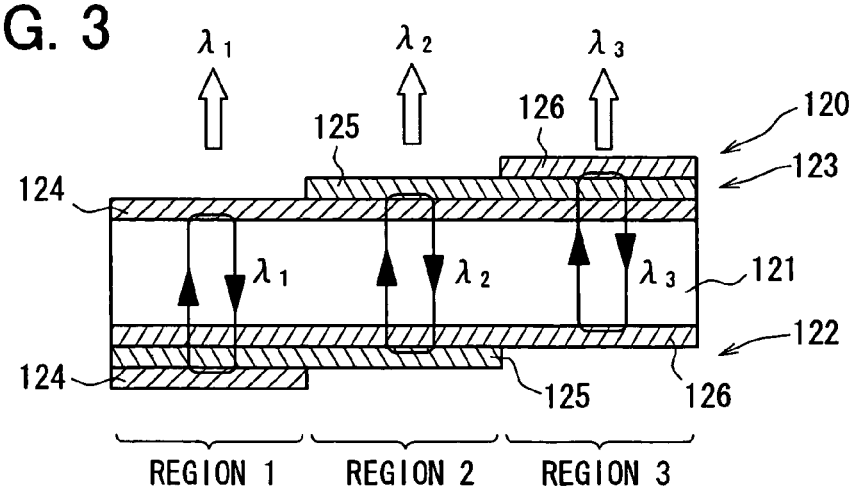
FIG. 3 is a partially enlarged cross sectional view showing a second reflection layer in the laser equipment.

Each of the second reflecting layers 122, 123 in accordance with this embodiment mode is constructed by forming an $Al_2O_3/TiO_2$ multilayer reflecting film by a technique of evaporation, spatter, etc. As shown in FIG. 3, each of the second reflecting layers 122, 123 is divided into areas 1 to 3 so as to be selectively resonated at a corresponding peak wavelength. In this embodiment mode, areas 1, 2 and 3 respectively become areas selectively resonated at $\lambda_1$, $\lambda_2$ and $\lambda_3$. FIG. 3 is an enlarged cross-sectional view showing the construction of the second reflecting layers 122, 123.

Concretely, a reflecting film 124 for $\lambda_1$, a reflecting film 125 for $\lambda_2$ and a reflecting film 126 for $\lambda_3$ respectively adjusted with respect to the film thickness of each layer constituting the $Al_2O_3/TiO_2$ multilayer reflecting film are laminated in an arbitrary order from the solid laser medium layer 121 side so as to attain high reflection at the above respective peak wavelengths $\lambda_1$, $\lambda_2$, $\lambda_3$ on an output face of the solid laser medium layer 121. In this embodiment mode, the reflecting films are laminated in the order of the reflecting film 124 for $\lambda_1$, the reflecting film 125 for $\lambda_2$ and the reflecting film 126 for $\lambda_3$. Further, the reflecting films are laminated on the excitation light input face of the solid laser medium layer 121 in an order from the solid laser medium layer 121 side reverse to the order onto the output face. In this embodiment mode, the reflecting films are laminated in the order of the reflecting film 126 for $\lambda_3$, the reflecting film 125 for $\lambda_2$ and the reflecting film 124 for $\lambda_1$. After the lamination, in each of areas 1 to 3, a useless reflecting film is removed by photolithography and etching such that the reflecting layer attaining high reflection at the corresponding peak wavelengths $\lambda_1$, $\lambda_2$, $\lambda_3$ becomes an outermost layer. The second reflecting layers 122, 123 are constructed in this way. Namely, in area 1, the reflecting film 125 for $\lambda_2$ and the reflecting film 126 for $\lambda_3$ on the output face are removed such that the reflecting film 124 for $\lambda_1$ becomes an outermost layer (a pair is formed). In area 2, the reflecting film 126 for $\lambda_3$ on the output face and the reflecting film 124 for $\lambda_1$ on the excitation light input face are removed such that the reflecting film 125 for $\lambda_2$ becomes an outermost layer (a pair is formed). In area 3, the reflecting film 124 for $\lambda_1$ and the reflecting film 125 for $\lambda_2$ on the excitation light input face are removed such that the reflecting film 126 for $\lambda_3$ becomes an outermost layer (a pair is formed).

In this embodiment mode, the film thicknesses of the respective layers ($Al_2O_3$ layer and $TiO_2$ layer) constituting the respective reflecting films 124 to 126 are set to values provided by dividing the corresponding peak wavelengths $\lambda_1$, $\lambda_2$, $\lambda_3$ by four times the refractive indexes. Further, the reflectivities of the respective reflecting films 124 to 126 with respect to lights of the corresponding peak wavelengths $\lambda_1$, $\lambda_2$, $\lambda_3$ are set such that the second reflecting layer 123 of the output side becomes smaller than the second reflecting layer 122 of the excitation light input side. Accordingly, the respective areas 1 to 3 are resonated at the corresponding peak wavelengths $\lambda_1$, $\lambda_2$, $\lambda_3$ and laser oscillation can be performed from the second reflecting layer 123 side.

Figure 4:
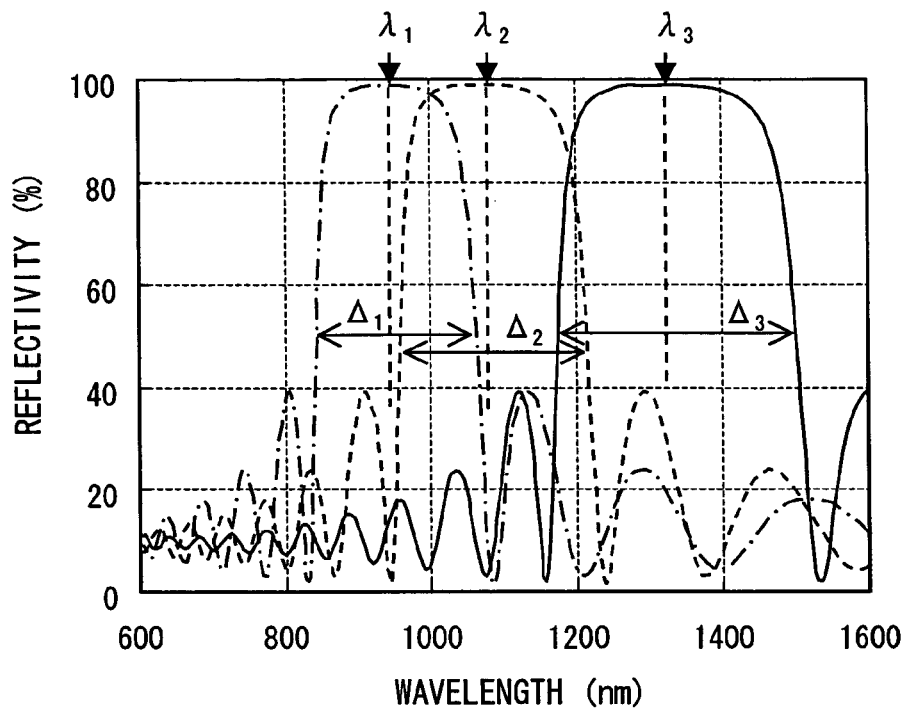
FIG. 4 is a graph showing a relationship between a wavelength and a reflectivity.

However, when a reflecting band (e.g., a wavelength width having 50% in reflectivity) showing high reflection in each of the reflecting films 124 to 126 is wide and one portion of the reflecting band includes an adjacent peak wavelength (i.e., a central peak wavelength of the reflecting band), light of the adjacent peak wavelength is also partially resonated together with the corresponding peak wavelength. Namely, no sufficient wavelength selecting property can be provided. Therefore, in this embodiment mode, as shown in FIG. 4, reflecting bands $\Delta 1$, $\Delta 2$ ($\Delta 2$, $\Delta 3$) each showing high reflection are set to satisfy $|\lambda_1-\lambda_2|>\Delta 1/2$, (or $|\lambda_2-\lambda_3|>\Delta 2/2$ ) and $|\lambda_2-\lambda_3|>\Delta 3/2$, in reflecting films 124, 125 (125, 126) corresponding to adjacent peak wavelengths $\lambda_1$, $\lambda_2$ ($\lambda_2$, $\lambda_3$). Accordingly, the respective areas 1 to 3 are selectively resonated at the corresponding peak wavelengths $\lambda_1$, $\lambda_2$, $\lambda_3$ and the laser oscillation can be performed. FIG. 4 is a view showing reflecting characteristics of the $Al_2O_3/TiO_2$ multilayer reflecting film for explaining the central wavelength and the reflecting band.

Figure 5:
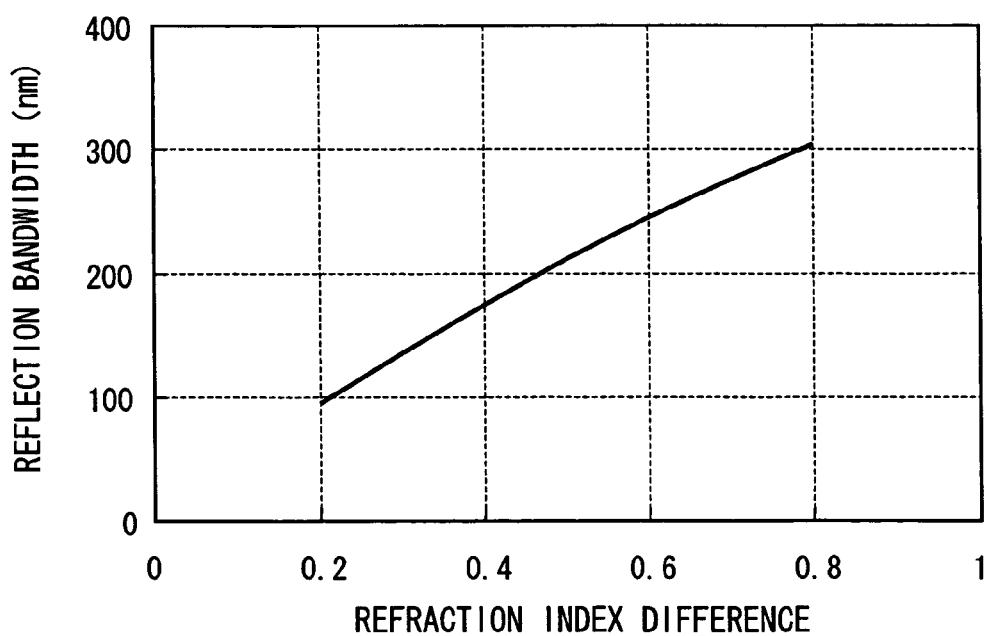
FIG. 5 is a graph showing a relationship between a difference of refraction index and a reflection bandwidth.

For example, as shown in FIG. 5, the reflecting band can be adjusted by the refractive indexes of the reflecting films 124 to 126 (constructional material). Namely, materials constituting the respective reflecting films 124 to 126 may be suitably selected. In this embodiment mode, the above relation is set to be satisfied by setting the $Al_2O_3/TiO_2$ multilayer reflecting film (e.g., a refractive index difference is set to 0.57 or less such that reflecting bands $\Delta 1$, $\Delta 2$ become 236 nm or less by setting $\lambda_1$:946 nm and $\lambda_2$:1064 nm). Namely, the resonators selectively resonated at peak wavelengths $\lambda_1$, $\lambda_2$, $\lambda_3$ are constructed within the same plane. FIG. 5 is a view showing the relation of the refractive index difference and the reflecting band.

Thus, the multiple wavelength laser device 100 in this embodiment mode is set to a construction in which the construction of the second reflecting layers 122, 123 is set to be different every areas 1 to 3 so that the laser oscillation is performed by selectively resonating lights of the corresponding peak wavelengths $\lambda_1$, $\lambda_2$, $\lambda_3$ every areas 1 to 3. Accordingly, light of a single wavelength outputted from the plane light emitting laser array 110 is set to excitation light, and plural lights of different wavelengths can be simultaneously outputted. For example, the construction of the second reflecting layer is at least one of a constructional material (refractive index), a thickness and a laminating number (period).

Further, plural resonators for selectively resonating lights of peak wavelengths $\lambda_1$, $\lambda_2$, $\lambda_3$ are constructed within the same plane by the construction of the second reflecting layers 122, 123. Accordingly, the physical constitution of the device 100 can be made compact. Further, in this embodiment mode, one plane light emitting laser array 110 is set to the excitation light generating section, and one solid laser medium layer 121 is collectively excited, and the wavelength converting section 120 is laminated and arranged on the plane light emitting laser array 110 with the second reflecting layer 122 as an abutting face. Accordingly, the physical constitution of the device 100 can be made more compact.

Further, the plane light emitting laser array 110 is adopted as the excitation light generating section, and longitudinal mode control of the excitation light is executed. Hence, a portion between the energy levels of rare earth ions or transition metal ions added to the solid laser medium layer 121 can be directly excited. Accordingly, conversion efficiency from turning-on electric power to the laser beam is high, and plural lights (laser beams) of different wavelengths can be efficiently outputted.

This embodiment mode shows an example in which areas 1 to 3 selectively resonated at the respective peak wavelengths $\lambda_1$, $\lambda_2$, $\lambda_3$ are constructed by the thicknesses (the film thicknesses of the $Al_2O_3$ layer and the $TiO_2$ layer constituting each of the reflecting films 124 to 126) of the respective reflecting films 124 to 126 constituting the second reflecting layers 122, 123. However, each of areas 1 to 3 may be also constructed by changing a constructional material (refractive index) and a laminating number (period).

Further, this embodiment mode shows an example in which the second reflecting layers 122, 123 are constructed by removing a useless reflecting film so as to form only a pair of reflecting films required in the respective areas 1 to 3 after the respective reflecting films 124 to 126 are collectively laminated in the respective areas 1 to 3. In accordance with such a construction, a manufacturing process can be simplified. However, the second reflecting layers 122, 123 may be also constructed by respectively selectively forming only the reflecting film 124 for $\lambda_1$, the reflecting film 125 for $\lambda_2$ and the reflecting film 126 for $\lambda_3$ in the respective areas 1 to 3 by photolithography. In this case, the second reflecting layers 122, 123 can be flattened in comparison with this embodiment mode.

Further, this embodiment mode shows an example in which areas 1 to 3 different in the construction of the second reflecting layers 122, 123 are arranged correspondingly to the number of peak wavelengths generated by the solid laser medium layer 121. However, the number of areas may be also set to be plural so as to output plural lights of different wavelengths. For example, it may be also set to a construction having only respective areas 1, 2 resonated at two peak wavelengths (e.g., $\lambda_1$, $\lambda_2$) among the three peak wavelengths $\lambda_1$, $\lambda_2$, $\lambda_3$.

Further, this embodiment mode shows an example in which the solid laser medium layer 121 generates three lights of different peak wavelengths by receiving the excitation light. However, if it is a construction for receiving the excitation light and generating plural lights of different peak wavelengths, this construction can be adopted as the solid laser medium layer 121.

Further, this embodiment mode shows an example in which the $Al_{x1}In_{y1}Ga_{1-x1-y1}As/Al_{x3}In_{y3}Ga_{1-x3-y3}As$ multiple quantum well layer 113 is adopted as the active layer 113 constituting the plane light emitting laser element 115, and the Nd:YAG crystal is adopted as the solid laser medium layer 121. However, the constructional materials of the active layer 113 and the solid laser medium layer 121 can be suitably selected and adopted in accordance with the wavelength outputted from the device 100. For example, an $In_{x2}Ga_{1-x2}As_{y2}P_{1-y2}/In_{x4}Ga_{1-x4}As_{y4}P_{1-y4}$ multiple quantum well layer can be adopted as the active layer 113. Further, YAG, YVO (YVO$_4$), GVO(GdVO$_4$), GGO(Gd$_3$Ga$_5$O$_{12}$), SVAP(Sr$_5$(VO$_4$)$_3$F), FAP((PO$_4$)$_3$F), SFAP(Sr$_5$(PO$_4$)$_3$F), YLF(YLiF$_4$), etc. added with various kinds of rare earth ions or transition metal ions can be adopted as the solid laser medium layer 121.

Further, this embodiment mode shows an example in which the wavelength converting section 120 is laminated and arranged on the plane light emitting laser array 110 with the second reflecting layer 122 as an abutting face. However, it may be also set to a construction for separating and arranging the wavelength converting section 120 on the plane light emitting laser array 110 (on the output face). However, when the wavelength converting section 120 is constructed so as to be laminated and arranged as shown in this embodiment mode, it may be made more compact. Accordingly, the distance from the active layer 113 to the solid laser medium layer 121 can be also shortened.

Second Embodiment Mode

Figure 6:
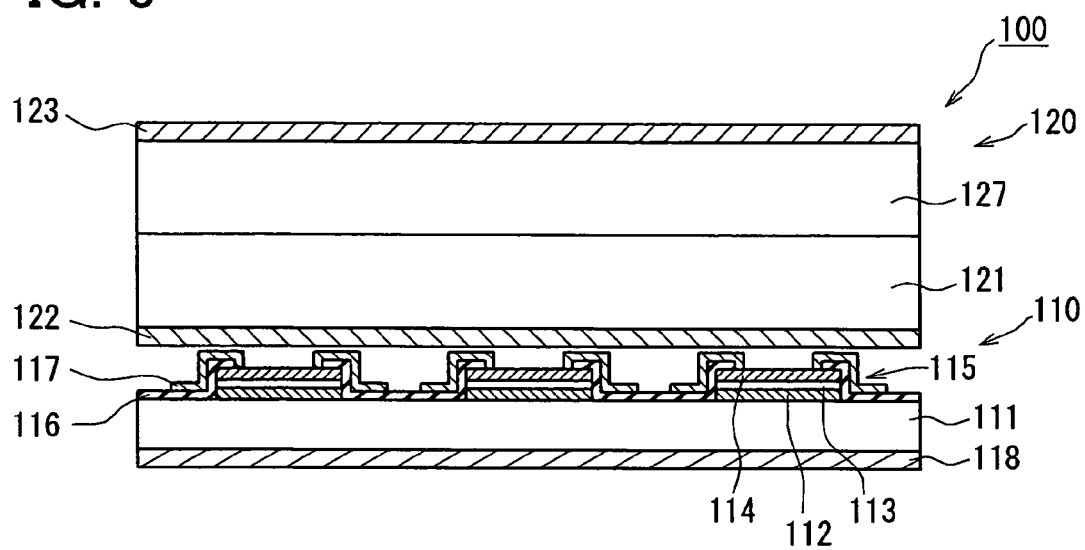
FIG. 6 is a cross sectional view showing a laser equipment according to a second embodiment.

Next, a second embodiment mode will be explained on the basis of FIG. 6. FIG. 6 is a cross-sectional view showing the schematic construction of a multiple wavelength laser device 100 in accordance with the second embodiment mode.

The multiple wavelength laser device 100 in accordance with the second embodiment mode is common to the multiple wavelength laser device 100 shown in the first embodiment mode in many portions.

As shown in FIG. 6, the multiple wavelength laser device 100 in accordance with this embodiment mode is characterized in that a wavelength converting layer 127 laminated and arranged on the output face of the solid laser medium layer 121 is included as the wavelength converting section 120. Plural laser beams having various wavelengths can be combined by arranging the wavelength converting layer 127 in this way.

In this embodiment mode, a nonlinear crystal for generating a second higher harmonic wave of the peak wavelength is adopted as a constructional material of the wavelength converting layer 127. A well-known material can be suitably selected and used as the nonlinear crystal in accordance with an inputted wavelength. For example, there are KTP (KTiOPO$_4$), LBO(LiB$_3$O$_5$), BiBO(BiB$_3$O$_6$), PPLTP (Periodically Poled KTP), etc.

Accordingly, lights having peak wavelengths $\lambda_1$, $\lambda_2$, $\lambda_3$ within ranges of 900 to 950 nm, 1040 to 1065 nm and 1300 to 1350 nm of a near infrared area generated from Nd ions and selectively resonated and laser-oscillated by the second reflecting layers 122, 123 can be converted into lights having wavelengths within ranges of 450 to 475 nm, 520 to 533 nm and 650 to 675 nm as visible light by the wavelength converting layer 127. Namely, this light can be utilized as a light source for RGB. In particular, in this embodiment mode, plural lights having the respective colors of R, G and B can be simultaneously outputted from the same face of one device 100.

FIG. 6 shows an example for arranging the wavelength converting layer 127 between the solid laser medium layer 121 and the second reflecting layer 123. However, it may be also set to a construction for laminating and arranging the wavelength converting layer 127 on the second reflecting layer 123.

Further, no constructional material of the wavelength converting layer 127 is limited to the nonlinear crystal for generating the second higher harmonic wave. It is good if this constructional material is a material able to convert the wavelength laser-oscillated from the resonator.

Third Embodiment Mode

Figure 7:
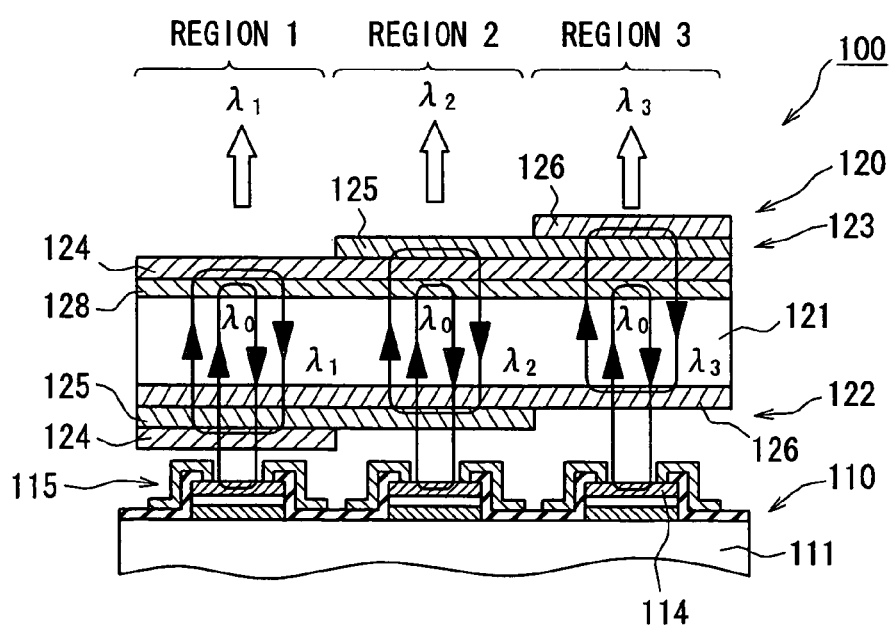
FIG. 7 is a partially enlarged cross sectional view showing a laser equipment according to a third embodiment.

Next, a third embodiment mode will be explained on the basis of FIG. 7. FIG. 7 is an enlarged cross-sectional view showing the schematic construction of a multiple wavelength laser device 100 in accordance with the third embodiment mode.

The multiple wavelength laser device 100 in accordance with the third embodiment mode is common to the multiple wavelength laser device 100 shown in the first embodiment mode in many portions.

As shown in FIG. 7, the multiple wavelength laser device 100 in accordance with this embodiment mode is characterized in that a third reflecting layer 128 laminated and arranged on the output face of the solid laser medium layer 121 and attaining high reflection at the wavelength of excitation light is included as the wavelength converting section 120. Thus, the excitation light (wavelength $\lambda_o$) is repeatedly reflected (repeated) through the solid laser medium layer 121 between the first reflecting layer 114 of the output side and the third reflecting layer 128 constituting the plane light emitting laser element 115 by arranging the third reflecting layer 128.

Accordingly, the excitation light can be efficiently absorbed to the solid laser medium layer 121. Namely, conversion efficiency from turning-on electric power to a laser beam (light outputted from the solid laser medium layer 121) can be improved.

Concretely, in the formation of the respective reflecting films 124 to 126 shown in the first embodiment mode, it is sufficient to form the respective reflecting films 124 to 126 after a reflecting film 128 for $\lambda_0$ respectively adjusted with respect to the film thickness of each layer constituting the $Al_2O_3/TiO_2$ multilayer reflecting film is formed so as to attain high reflection at wavelength $\lambda_0$ of the excitation light on the output face of the solid laser medium layer 121. Thus, if the reflecting film 128 for $\lambda_0$ is set to an innermost layer, the reflecting film 128 for $\lambda_0$ can be left on the entire output face of the solid laser medium layer 121 even when an unnecessary reflecting film is removed after each of the reflecting films 124 to 126 is laminated.

It is also possible to adopt a construction in which the construction according to this embodiment mode and the wavelength converting layer 127 shown in the second embodiment mode are combined.

Fourth Embodiment Mode

Figure 8:
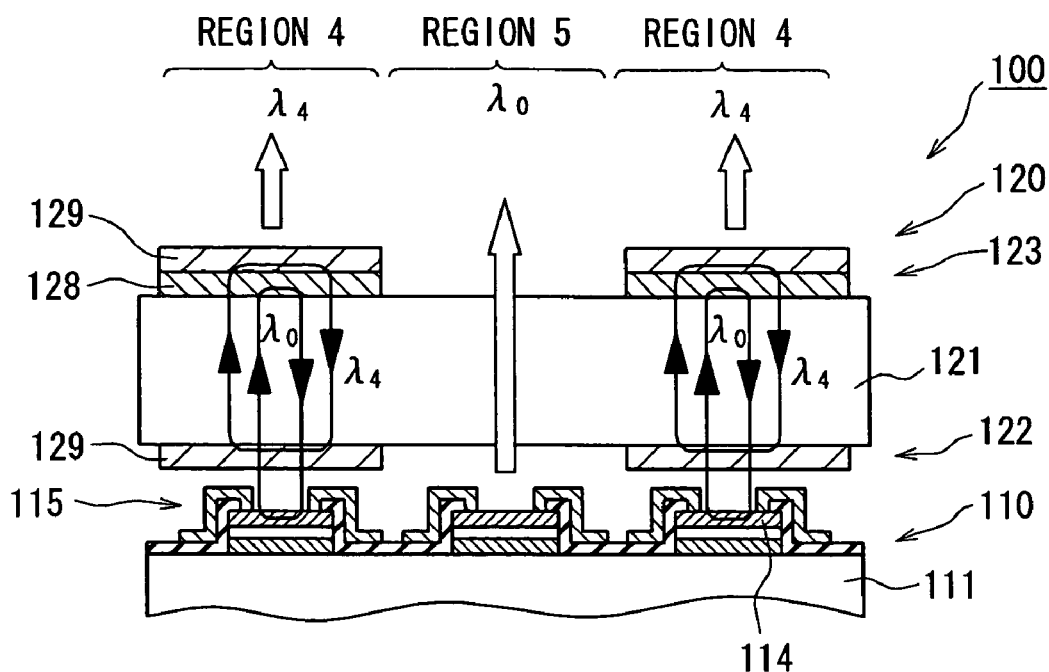
FIG. 8 is a partially enlarged cross sectional view showing a laser equipment according to a fourth embodiment.

A fourth embodiment mode next be explained on the basis of FIG. 8. FIG. 8 is an enlarged cross-sectional view showing the schematic construction of a multiple wavelength laser device 100 in accordance with the fourth embodiment mode.

The multiple wavelength laser device 100 in accordance with the fourth embodiment mode is common to the multiple wavelength laser devices 100 shown in the first to third embodiment modes in many portions.

As shown in FIG. 8, the multiple wavelength laser device 100 in accordance with this embodiment mode is characterized in that this multiple wavelength laser device 100 is constructed so as to output plural lights of different wavelengths by a forming range (formation existence) of the second reflecting layers 122, 123. Namely, it is, characterized in that the wavelength converting section 120 has area 4 as a resonant area forming the second reflecting layers 122, 123, and area 5 as an excitation light passing area not forming at least one of the second reflecting layers 122, 123 on the solid laser medium layer 121.

Figure 9:
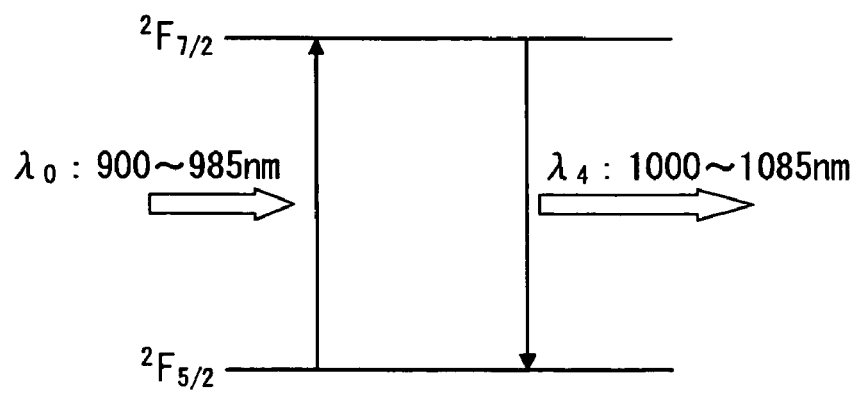
FIG. 9 is a schematic chart showing excitation and transition in a solid laser medium layer according to a fourth embodiment.

In this embodiment mode, a Yb:YAG($Y_3Al_5O_{12}$) crystal is adopted as a constructional material of the solid laser medium layer 121, and the solid laser medium layer 121 is arranged so as to cover the entire output face of the plane light emitting laser array 110. As shown in FIG. 9, when excitation light adjusted within a range of 900 to 985 nm in light emission wavelength $\lambda_0$ is received from the plane light emitting laser array 110, an electron is selectively excited during the energy level of a Yb ion added to the YAG crystal from $^2F_{5/2}$ to $^2F_{7/2}$. FIG. 9 is a typical view showing excitation and transition in the solid laser medium layer 121.

As shown in FIG. 2, the electron excited to energy level $^2F_{7/2}$ is transited to $^2F_{5/2}$. At this time, a laser beam having peak wavelength $\lambda_4$ within a range of 1000 to 1085 nm is generated in accordance with wavelength $\lambda_0$ of the excitation light. Thus, light emission efficiency is good since the excitation level and the light emitting level are the same level.

Similar to the first embodiment mode, the second reflecting layers 122, 123 are constructed by the $Al_2O_3/TiO_2$ multilayer reflecting film, and are selectively formed on the output face and the excitation light input face of the solid laser medium layer 121 corresponding to area 4. Concretely, the second reflecting layers 122, 123 are constructed from a reflecting film 129 for $\lambda_4$ adjusted in thickness (the film thickness of each of the $Al_2O_3$ layer and the $TiO_2$ layer) so as to be resonated at wavelength $\lambda_4$. As a forming method of the reflecting film 129 for $\lambda_4$ in area 4, after the reflecting film 129 for $\lambda_4$ is formed on the entire face, the reflecting film 129 for $\lambda_4$ in area 5 forming no second reflecting layers 122, 123 may be removed by etching, and the reflecting film 129 for $\lambda_4$ may be also selectively formed in only area 4. In area 5, one portion of the excitation light is absorbed to the solid laser medium layer 121, but is not resonated. Therefore, a great part of the excitation light passes through the solid laser medium layer 121.

The construction of the plane light emitting laser array 110 is similar to that in the first embodiment mode, but the composition of the $Al_{x1}In_{y1}Ga_{1-x1-y1}As/Al_{x3}In_{y3}Ga_{1-x3-y3}As$ multiple quantum well layer 113 constituting the active layer 113 is adjusted such that light emitting wavelength $\lambda_0$ lies within a range of 900 to 985 nm so as to excite the Yb ion.

Thus, in accordance with the multiple wavelength laser device 100 in this embodiment mode, light of wavelength $\lambda_4$ resonated and laser-oscillated by the second reflecting layers 122, 123, and the excitation light of wavelength $\lambda_0$ passing through the solid laser medium layer 121 can be simultaneously outputted. Namely, plural lights of different wavelengths can be simultaneously outputted.

Further, one plane light emitting laser array 110 is set to the excitation light generating section (excitation light source) and one solid laser medium layer 121 is collectively excited, and plural lights of wavelengths different in accordance with the existence of the second reflecting layers 122, 123 can be simultaneously outputted. Accordingly, the physical constitution of the device 100 can be made compact. The wavelength converting section 120 may be also contact-arranged (laminated and arranged) on the excitation light output face of the plane light emitting laser array 110, and may be also arranged so as to be separated from this excitation light output face. When the contact arrangement is set, it can be made more compact.

Further, the plane light emitting laser array 110 is adopted as the excitation light generating section (excitation light source), and longitudinal mode control of the excitation light is executed. Accordingly, a portion between the energy levels of rare earth ions or transition metal ions added to the solid laser medium layer 121 can be directly excited. Accordingly, plural lights of different wavelengths can be efficiently outputted.

The plane light emitting laser array 110 is adopted as the excitation light generating section (excitation light source). Accordingly, if it is set to a construction for individually controlling the plane light emitting laser array element 115, the light emitting intensities of plural lights of different wavelengths can be also respectively adjusted.

It is also possible to adopt a construction in which the construction shown in each of the first to third embodiment modes is combined with the above construction. As shown in FIG. 8, it may be also set to a construction in which a reflecting film 128 for $\lambda_0$ for reflecting the excitation light is formed on an output face corresponding to area 4 of the solid laser medium layer 121. In this case, operations and effects similar to those of the third embodiment mode can be expected. When a single laser beam is outputted from area 4, the reflecting film 128 for $\lambda_0$ may be also formed on the reflecting film 129 for $\lambda_4$.

Figure 10:
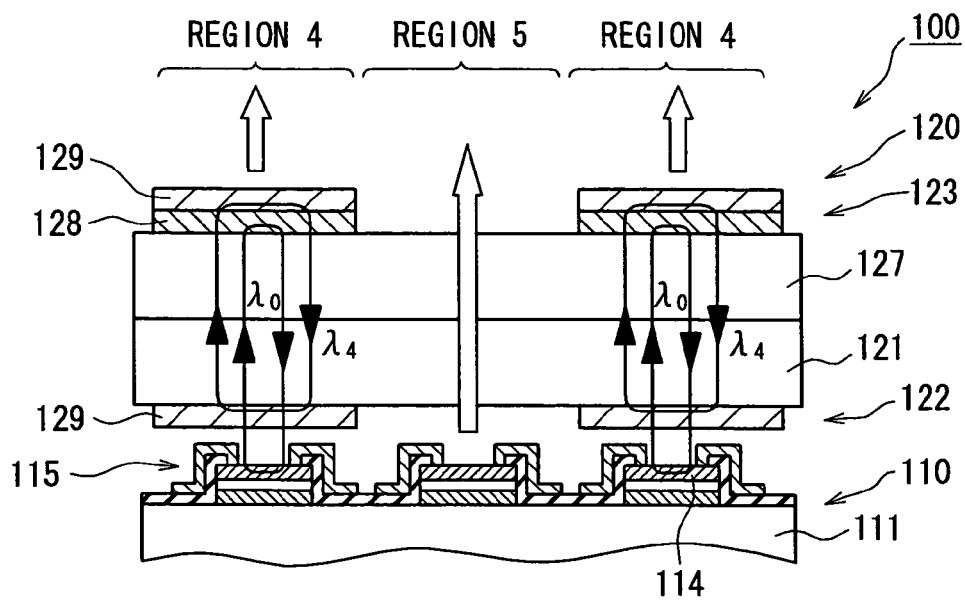
FIG. 10 is a partially enlarged cross sectional view showing a laser equipment according to a modification of the fourth embodiment.

Further, as shown in FIG. 10, it is also possible to adopt a construction for laminating and arranging the wavelength converting layer 127 on the output face of the solid laser medium layer 121. In this case, operations and effects similar to those of the second embodiment mode can be expected.

FIG. 10 is an enlarged cross-sectional view showing a modified example.

Further, this embodiment mode shows an example in which the Yb:YAG($Y_3Al_5O_{12}$) crystal is used as the constructional material of the solid laser medium layer 121, and the second reflecting layers 122, 123 are constructed so as to resonate light of wavelength $\lambda_4$ generated in excitation and transition of the Yb ion. Namely, this embodiment mode shows a construction for outputting a single laser beam from area 4. However, the construction of the second reflecting layers 122, 123 (reflecting films 124 to 126) shown in the first embodiment mode may be also applied to area 4 in accordance with this embodiment mode. Thus, more kinds of lights of different wavelengths can be simultaneously outputted.

Fifth Embodiment Mode

Figure 11:
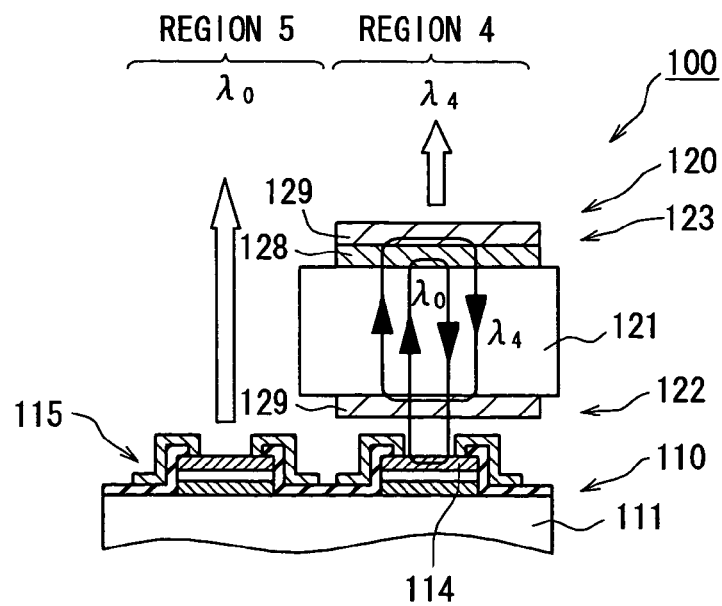
FIG. 11 is a partially enlarged cross sectional view showing a laser equipment according to a fifth embodiment.

A fifth embodiment mode will next be explained on the basis of FIG. 11. FIG. 11 is an enlarged cross-sectional view showing the schematic construction of a multiple wavelength laser device 100 in accordance with the fifth embodiment mode.

The multiple wavelength laser device 100 in accordance with the fifth embodiment mode is common to the multiple wavelength laser devices 100 shown in the first to fourth embodiment modes in many portions.

As shown in FIG. 11, the multiple wavelength laser device 100 in accordance with this embodiment mode is characterized in that the multiple wavelength laser device 100 is constructed so as to output plural lights of different wavelengths by the arrangement of the wavelength converting section 120 with respect to the plane light emitting laser array 110. Namely, the multiple wavelength laser device 100 is characterized in that the multiple wavelength laser device 100 has area 4 as a resonant area for arranging the wavelength converting section 120 on the plane light emitting laser array 110, and area 5 as an excitation light passing area for arranging no wavelength converting section 120.

In this embodiment mode, similar to the fourth embodiment mode, the Yb:YAG($Y_3Al_5O_{12}$) crystal is adopted as the constructional material of the solid laser medium layer 121, and the solid laser medium layer 121 is selectively arranged on the plane light emitting laser array 110 corresponding to area 4. The second reflecting layers 122, 123 are constructed from a reflecting film 129 for $\lambda_4$ adjusted in thickness (the film thickness of each of the $Al_2O_3$ layer and the $TiO_2$ layer) so as to be resonated at wavelength $\lambda_4$ generated by Yb. Thus, the wavelength converting section 120 is arranged in only one portion on the output face of the plane light emitting laser array 110, and area 4 as the resonant area is constructed. An area for arranging no wavelength converting section 120 constitutes area 5 as the excitation light passing area.

Thus, in accordance with the multiple wavelength laser device 100 in this embodiment mode, light of wavelength $\lambda_4$ resonated and laser-oscillated by the second reflecting layers 122, 123 and the excitation light of wavelength $\lambda_0$ can be simultaneously outputted. Namely, plural lights of different wavelengths can be simultaneously outputted.

Further, one plane light emitting laser array 110 is set to the excitation light generating section (excitation light source) and one solid laser medium layer 121 is collectively excited, and plural lights of different wavelengths can be simultaneously outputted in accordance with the existence of the wavelength converting section 120. Accordingly, the physical constitution of the device 100 can be made compact. The wavelength converting section 120 may be also contact-arranged (laminated and arranged) on the excitation light output face of the plane light emitting laser array 110, and may be also arranged so as to be separated from this excitation light output face. When this contact arrangement is set, it can be made more compact.

Further, the plane light emitting laser array 110 is adopted as the excitation light generating section (excitation light source), and longitudinal mode control of the excitation light is executed. Accordingly, a portion between the energy levels of rare earth ions or transition metal ions added to the solid laser medium layer 121 can be directly excited. Accordingly, plural lights of different wavelengths can be efficiently outputted.

The plane light emitting laser array 110 is adopted as the excitation light generating section (excitation light source). Accordingly, if it is set to a construction for individually controlling the plane light emitting laser array element 115, the light emitting intensities of plural lights of different wavelengths can be also respectively adjusted.

Further, the construction shown in each of the first to third embodiment modes can be also combined with the above construction. As shown in FIG. 11, it may be also set to a construction in which a reflecting film 128 for $\lambda_0$ for reflecting the excitation light is formed on the output face of the solid laser medium layer 121. In this case, operations and effects similar to those of the third embodiment mode can be expected. When a single laser beam is outputted from area 4, the reflecting film 128 for $\lambda_0$ may be also formed on the reflecting film 129 for $\lambda_4$. Further, a construction for laminating and arranging the wavelength converting layer 127 on the output face of the solid laser medium layer 121 can be also adopted. In this case, operations and effects similar to those of the second embodiment mode can be expected.

Further, this embodiment mode shows an example in which the Yb:YAG($Y_3Al_5O_{12}$) crystal is used as the constructional material of the solid laser medium layer 121, and the second reflecting layers 122, 123 are constructed so as to resonate light of wavelength $\lambda_4$ generated in excitation and transition of the Yb ion. Namely, this embodiment mode shows a construction for outputting a single laser beam from area 4. However, the construction of the second reflecting layers 122, 123 (reflecting films 124 to 126) shown in the first embodiment mode may be also applied to area 4 in accordance with this embodiment mode. Thus, more kinds of lights of different wavelengths can be simultaneously outputted.

Sixth Embodiment Mode

Figure 12:
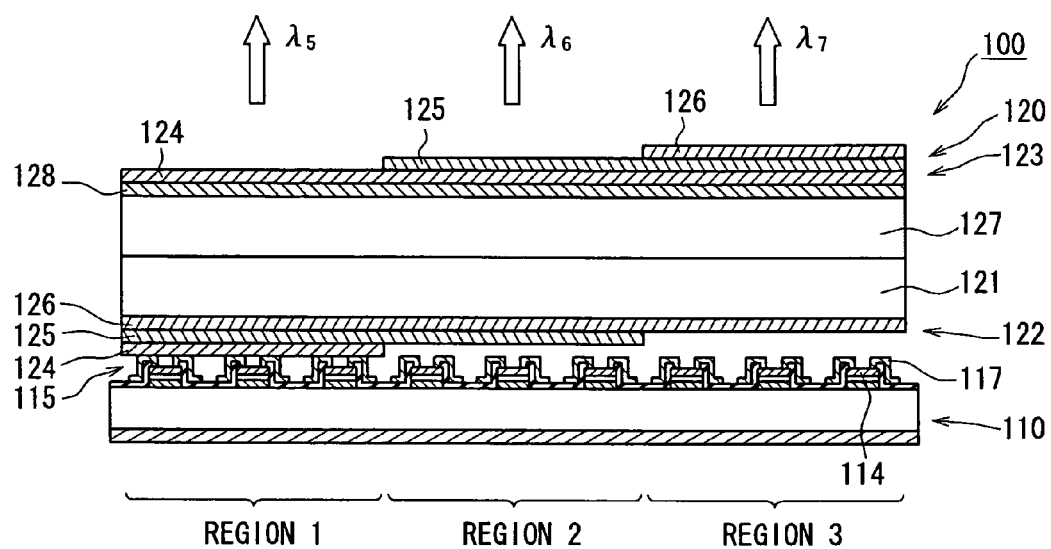
FIG. 12 is a partially enlarged cross sectional view showing a laser equipment according to a sixth embodiment.

A sixth embodiment mode will next be explained on the basis of FIG. 12. FIG. 12 is an enlarged cross-sectional view showing the schematic construction of a multiple wavelength laser device 100 in accordance with the sixth embodiment mode.

The multiple wavelength laser device 100 in accordance with the sixth embodiment mode is common to the multiple wavelength laser devices 100 shown in the first to fifth embodiment modes in many portions.

The multiple wavelength laser device 100 in accordance with this embodiment mode is characterized in that the plane light emitting laser element 115 is respectively electrically independent, and is individually constructed so as to be controlled. Namely, the multiple wavelength laser device 100 is characterized in that the multiple wavelength laser device 100 is constructed so as to adjust brightness of light outputted from the device 100. When light outputted from the device 100 is synthesized, brightness and a color tone can be adjusted.

Concretely, the construction of the plane light emitting laser array 110 and the construction of the wavelength converting section 120 are similar to a combination of the first to third embodiment modes, and are set so as to output lights having wavelengths $\lambda_5, \lambda_6, \lambda_7$ within ranges of 450 to 475 nm (blue color), 520 to 533 nm (green color) and 650 to 675 nm (red color) as visible light. Namely, this light can be utilized as a light source for RGB.

Further, plural plane light emitting laser elements 115 are arranged correspondently to respective areas 1 to 3 for outputting lights of different wavelengths. Thus, a predetermined desirable laser beam output can be easily secured by arranging the plural plane light emitting laser elements 115 correspondingly to one area. Further, the plane light emitting laser elements 115 are respectively constructed so as to be independently operated and controlled (p-type electrodes 117 are insulated and separated every element 115). The device 100 includes an unillustrated light emitting control means for controlling light emission timing (light emission on and off and light emission time) of each plane light emitting laser element 115.

Thus, in accordance with the multiple wavelength laser device 100 in this embodiment mode, brightness of each color can be adjusted by controlling a light emitting number (i.e., light emission on and off of each plane light emitting laser element 115) of the plane light emitting laser element 115 in each of areas 1 to 3 by the light emitting control means. Further, when each color is synthesized, the brightness and the color tone of synthesized light can be adjusted. Similar effects can be also expected by controlling the light emission time. It may be also set to a construction for controlling both the light emission number and the light emission time.

No control method using the light emitting control means is particularly limited. For example, it may be also set to a construction in which the light emitting control means controls the light emission timing of each plane light emitting laser element 115 so as to hold predetermined desirable brightness and color tone on the basis of a signal from a sensor (e.g., a sensor for detecting light outputted from the device 100) for measuring a physical amount. Further, the light emission timing of each plane light emitting laser element 115 may be also controlled in accordance with a program stored in advance.

Further, no light as a controlled object is limited to visible light. It may be also set to a construction in which no wavelength converting section 120 includes the wavelength converting layer 127. Further, it may be also set to a construction including no reflecting film 128 for $\lambda_0$. The construction in accordance with this embodiment mode may be also combined with the fourth and fifth embodiment modes. In this case, the operation of the plane light emitting laser element 115 corresponding to the excitation light outputted to the exterior can be also similarly controlled.

Seventh Embodiment Mode

Figure 13:
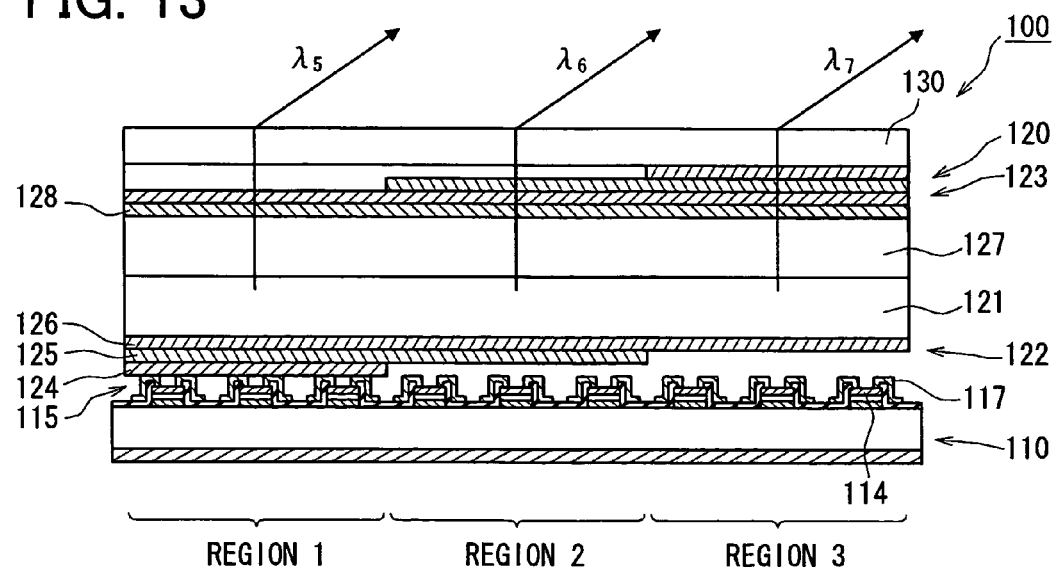
FIG. 13 is a partially enlarged cross sectional view showing a laser equipment according to a seventh embodiment.

A seventh embodiment mode will next be explained on the basis of FIG. 13. FIG. 13 is an enlarged cross-sectional view showing the schematic construction of a multiple wavelength laser device 100 in accordance with the seventh embodiment mode.

The multiple wavelength laser device 100 in accordance with the seventh embodiment mode is common to the multiple wavelength laser devices 100 shown in the first to sixth embodiment modes in many portions.

As shown in FIG. 13, the multiple wavelength laser device 100 in accordance with this embodiment mode is characterized in that the multiple wavelength laser device 100 includes an optical element for an adjustment arranged on at least the output face of the wavelength converting section 120 and constructed so as to adjust an output direction of output light to the exterior. Namely, the multiple wavelength laser device 100 is characterized in that the multiple wavelength laser device 100 is constructed so as to control the output direction of a laser beam outputted from the device 100.

Concretely, for example, with respect to the construction shown in the sixth embodiment mode, a micro mirror array 130 including unillustrated plural micro mirrors of an electrostatic driving type formed in a semiconductor substrate by MEMS is adopted as the optical element for an adjustment arranged on the output face of the wavelength converting section 120. For example, the micro mirror is formed correspondingly to each plane light emitting laser element 115. The aperture (the size of a substrate planar direction) of each plane light emitting laser element 115 constituting the above plane light emitting laser array 110 is several µm to several hundred µm. The size of the wavelength converting section 120 corresponding to this aperture can be set to 1 mm or less even in consideration of a spread of the excitation light. Accordingly, the micro mirror array 130 formed by MEMS can be adopted. For example, such a micro mirror is disclosed in JP-A-2005-321663, etc.

In this embodiment mode, as shown in FIG. 13, the micro mirror array 130 is arranged so as to come in contact with the output face of the wavelength converting section 120. However, the micro mirror array 130 may be also arranged so as to be separated from this output face. Further, each micro mirror constituting the micro mirror array 130 is respectively constructed so as to be independently operated. The device 100 includes an unillustrated angle control means for controlling the operation (an angle with respect to the substrate plane) of each micro mirror.

Thus, in accordance with the multiple wavelength laser device 100 in this embodiment mode, the angle of each micro mirror constituting the micro mirror array 130 can be adjusted by the angle control means. Accordingly, the output direction and the brightness of each color in each of areas 1 to 3 can be adjusted. Further, when each color is synthesized, the output direction, the brightness and the color tone of synthesized light can be adjusted.

No control method using the angle control means is particularly limited. For example, it may be also set to a construction in which the angle control means controls the angle of each micro mirror so as to hold predetermined desirable brightness and color tone on the basis of a signal from a sensor (e.g., a sensor for detecting light outputted from the device 100) for measuring a physical amount. Further, the angle of each micro mirror may be also controlled along a program stored in advance.

Further, the construction in accordance with this embodiment mode may be also combined with the fourth and fifth embodiment modes. For example, the output direction of the excitation light outputted to the exterior can be also controlled by the optical element for an adjustment.

Further, this embodiment mode shows an example of the micro mirror array 130 as an example of the optical element for an adjustment. However, this optical element is not limited to the above micro mirror array 130, but may be set to an element able to adjust the output direction of light outputted to the exterior.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A laser equipment for outputting a plurality of output lights having different wavelengths, comprising:
   a substrate;
   an excitation light generation element for emitting a plurality of excitation lights, wherein the excitation light generation element includes a plurality of surface emitting laser elements having a pair of first reflection layers and an activation layer disposed between the pair of first reflection layers, and wherein the surface emitting laser elements are disposed on the substrate so that the surface emitting laser elements provide a surface emitting laser array; and
   a light converter having a pair of second reflection layers and a solid laser medium layer disposed between the pair of second reflection layers, wherein the pair of second reflection layers and the solid laser medium Layer provide a resonator, wherein
   the solid laser medium layer generates a plurality of lights having different peak wavelengths by receiving the excitation lights,
   the light converter is disposed on an output surface of the excitation light generation element,
   the light converter outputs the output lights,
   each wavelength of the output light is different from a wavelength of the excitation light,
   the resonator is divided into a plurality of resonator regions according to a structure of the second reflection layers,
   the resonator regions resonate at different peak wavelengths of the output lights, respectively, so that the resonator regions having the same solid laser medium layer respectively output the output lights having different wavelenghts,
   the pair of second reflection layers includes an output side second reflection layer and an input side second reflection layer,
   the output side second reflection layer includes a plurality of reflection films, each of which has a maximum reflectivity at the peak wavelength of the corresponding output light,
   the reflection films in the output side second reflection layer are stacked from the solid laser medium layer in a predetermined output-side peak wavelength order,
   the input side second reflection layer includes a plurality of reflection films, each of which has a maximum reflectivity at the peak wavelength of the corresponding output light,
   the reflection films in the input side second reflection layer are stacked from the solid laser medium layer in a predetermined input-side peak wavelength order, which is opposite to the output-side peak wavelength order, and
   an utmost outer reflection film of the stacked reflection films of the output side second reflection layer in each resonator region has a maximum reflectivity at a peak wavelength of the corresponding output light of the resonator region the peak wavelength of which is equal to a peak wavelength of an utmost outer reflection film of the stacked reflection films of the input side second reflection layer in the resonator region.

2. The equipment according to claim 1, wherein
   each reflection film includes two different refraction index layers,
   each different refraction index layer has a thickness, a refraction index, and a corresponding peak wavelength of the output light, and
   the thickness of one different refraction index layer in one of the reflection films is equal to the corresponding peak wavelength divided by four times of the refraction index.

3. The equipment according to claim 1, wherein
   one of the reflection films has a corresponding peak wavelength of the output light defined as $\lambda 1$ and a reflection bandwidth defined as $\Delta 1$,
   another one of the reflection films has another corresponding peak wavelength of the output light defined as $\lambda 2$ and another reflection bandwidth defined as $\Delta 2$,
   the peak wavelengths of $\lambda 1$ and $\lambda 2$ and the reflection bandwidths of $\Delta 1$ and $\Delta 2$ satisfy relationships of $|\lambda_1 - \lambda_2| > \Delta 1/2$ and $|\lambda_1 - \lambda_2| > \Delta 2/2$.

4. The equipment according to claim 1, wherein the solid laser medium layer is made of a host crystal having a neodymium atom.

5. The equipment according to claim 4, wherein the activation layer in each surface emitting laser element includes a quantum well layer made of $Al_{x1}In_{y1}Ga_{1-x1-y1}As$.

6. The equipment according to claim 4, wherein the activation layer in each surface emitting laser element includes a quantum well layer made of $In_{x2}Ga_{1-x2}As_{y2}P_{1-y2}$.

7. The equipment according to claim 1, wherein the surface emitting laser elements are independently and electrically controlled, respectively.

* * * * *